United States Patent
Moriya et al.

(10) Patent No.: US 8,018,120 B2
(45) Date of Patent: Sep. 13, 2011

(54) SURFACE ACOUSTIC WAVE DEVICE AND METHOD OF FABRICATING THE SAME

(75) Inventors: Akira Moriya, Yokohama (JP); Osamu Kawachi, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 196 days.

(21) Appl. No.: 12/366,971

(22) Filed: Feb. 6, 2009

(65) Prior Publication Data
US 2010/0038992 A1 Feb. 18, 2010

(30) Foreign Application Priority Data
Feb. 8, 2008 (JP) .................... 2008-028269

(51) Int. Cl.
*H01L 41/08* (2006.01)
(52) U.S. Cl. ............. 310/313 R; 310/313 A; 310/344; 310/346
(58) Field of Classification Search ............ 310/340, 310/344, 346, 313 A
See application file for complete search history.

(56) References Cited

U.S. PATENT DOCUMENTS

| | | | | | |
|---|---|---|---|---|---|
| 3,916,348 | A | * | 10/1975 | Toda et al. | 333/155 |
| 3,965,444 | A | * | 6/1976 | Willingham et al. | 333/155 |
| 4,699,682 | A | * | 10/1987 | Takishima | 156/292 |
| 5,059,848 | A | * | 10/1991 | Mariani | 310/313 R |
| 7,408,286 | B1 | * | 8/2008 | Bhattacharjee et al. | 310/346 |
| 7,564,174 | B2 | * | 7/2009 | Matsuda et al. | 310/346 |
| 7,675,387 | B2 | * | 3/2010 | Sakiyama et al. | 333/133 |
| 7,772,742 | B2 | * | 8/2010 | Kando | 310/313 A |
| 2007/0120623 | A1 | | 5/2007 | Sakiyama et al. | |
| 2008/0292127 | A1 | | 11/2008 | Ruile et al. | |

FOREIGN PATENT DOCUMENTS

| | | |
|---|---|---|
| CN | 1976223 A | 6/2007 |
| JP | 2000-261284 A | 9/2000 |
| JP | 2009-021701 | 1/2009 |
| WO | WO 2007/059733 A1 | 5/2007 |

* cited by examiner

*Primary Examiner* — Mark Budd
(74) *Attorney, Agent, or Firm* — Chen Yoshimura LLP

(57) ABSTRACT

A surface acoustic wave device includes a piezoelectric substrate; comb electrodes provided on a first surface of the piezoelectric substrate; and an insulating film provided on at least one of the first surface of the piezoelectric substrate and a second surface thereof opposite to the first surface, the insulating film having a thickness greater than that of the piezoelectric substrate and having a linear expansion coefficient smaller than that of the piezoelectric substrate in a direction of propagation of a surface acoustic wave.

4 Claims, 7 Drawing Sheets

SURFACE ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2008-028269, filed on Feb. 8, 2008, the entire contents of which are incorporated herein by reference.

FIELD

The present invention generally relates to surface acoustic wave devices, and more particularly, to improvements in the temperature characteristic of a surface acoustic wave device. Further, the present invention relates to a method for fabricating the above-mentioned surface acoustic wave device.

BACKGROUND

A surface acoustic wave device (SAW device) is capable of exciting an acoustic wave by applying power to comb electrodes of an interdigital transducer (IDT) formed on a piezoelectric substrate. The SAW device is widely used for various circuits that process radio signals in a frequency band of, for example, 45 MHz to 2 GHz. Examples of these circuits are bandpass filters for transmission, bandpass filters for reception, local oscillation filters, antenna duplexers, intermediate frequency filters, and FM modulators.

The SAW device needs a cavity above a functional part (electrode fingers of IDT) of a SAW element composed of comb electrodes in order to secure the performance of the SAW element. A conventional SAW device employs a ceramic package having a recess in which the SAW element is mounted. A metal lid covers the recess, so that a cavity can be defined above the functional part of the SAW element. Wire bonding is used to make electrical connections between the SAW element and interconnections provided on the ceramic package.

However, wire bonding uses wires, which prevents downsizing of the SAW device. In order to achieve downsizing, flip-chip bonding is developed. Flip-chip bonding realizes downsizing because of wireless mounting.

Recently, there has been a more strict demand for downsizing the SAW device. There are some cases where even flip-chip bonding is not capable of realizing required downsizing. There is a proposal for further downsizing. Japanese Patent Application Publication No. 2000-261284 describes a SAW element provided on a surface of a piezoelectric substrate. A cover is provided on the surface of the piezoelectric substrate in order to define a cavity above the functional part of the SAW element. The cover is used as a package. This type of packaging is called wafer level package (WLP). This realizes further miniaturization.

The SAW device using the piezoelectric substrate has a problem such that the frequency characteristic is affected due to expansion and contraction of the piezoelectric substrate. The frequency characteristic of the SAW device is more greatly affected as the piezoelectric substrate has a greater amount of expansion and contraction. The piezoelectric substrate expands and contracts with the amount of expansion and contraction that depends on the linear expansion coefficient due to temperature change. The piezoelectric substrate may be typically made of lithium tantalate ($LiTaO_3$) or lithium niobate ($LiNbO_3$), which has a great electro-mechanical coupling coefficient. However, these substrates have great linear expansion coefficients, and greatly expand and contract due to temperature change.

SUMMARY

According to an aspect of the present invention, there is provided a surface acoustic wave device including: a piezoelectric substrate; comb electrodes provided on a first surface of the piezoelectric substrate; and an insulating film provided on at least one of the first surface of the piezoelectric substrate and a second surface thereof opposite to the first surface, the insulating film having a thickness greater than that of the piezoelectric substrate and having a linear expansion coefficient smaller than that of the piezoelectric substrate in a direction of propagation of a surface acoustic wave.

According to another aspect of the present invention, there is provided a method of fabricating a surface acoustic wave device, the method including: forming comb electrodes on a first surface of a piezoelectric substrate; thinning the piezoelectric substrate after the comb electrodes are formed; and forming an insulating film on at least one of the first surface of the piezoelectric substrate and a second surface thereof opposite to the first surface, the insulating film having a thickness greater than that of the piezoelectric substrate and having a linear expansion coefficient smaller than that of the piezoelectric substrate in a direction of propagation of a surface acoustic wave.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A description will now be given, with reference to the accompanying drawings, of embodiments of the present invention.

First Embodiment

Figure 1:
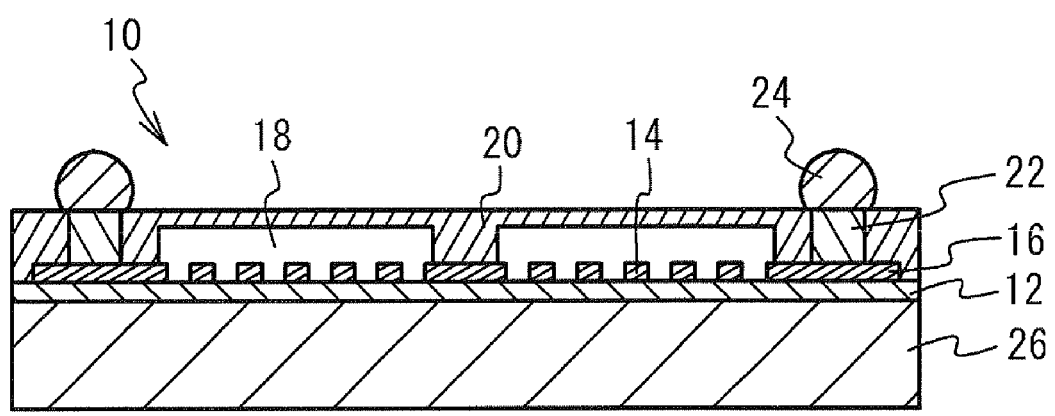
FIG. 1 is a cross-sectional view of a SAW device in accordance with a first embodiment of the present invention.

FIG. 1 is a cross-sectional view of a SAW device in accordance with a first embodiment of the present invention taken along a line so that cross sections of comb electrodes and column electrodes appear.

Referring to FIG. 1, a SAW device 10 has a piezoelectric substrate 12 having a main surface on which comb electrodes 14 and reflection electrodes (not shown for the sake of simplicity) are provided. The piezoelectric substrate 12 may be made of lithium tantalate (LiTaO$_3$) or lithium niobate (LiNbO$_3$). The comb electrodes 14 and the reflection electrodes may be aluminum (Al) or an Al alloy with copper (Cu) being added. Interconnection electrodes 16 are provided on the main surface of the piezoelectric substrate 12 and are electrically connected to the comb electrodes 14. The interconnection electrodes 16 may be made of Al or an Al alloy with copper being added.

A resin portion 20 is provided on the main surface of the piezoelectric substrate 12 so as to define cavities 18 provided above the comb electrodes 14. The resin portion 20 may be made of epoxy resin. Column electrodes 22 are provided on the interconnection electrodes 16 and pass through the resin portion 20. The column electrodes 22 may be made of copper, nickel (Ni) or gold (Au). Solder bumps 24 are provided on the column electrodes 22. The combinations of the column electrodes 22 and the solder bumps 24 function as terminals for making electrical connections with external parts in flip-chip mounting of the SAW device.

An insulating film 26 is provided on the back surface of the piezoelectric substrate 12. The thickness of the insulating film 26 is greater than that of the piezoelectric substrate 12. The insulating film 26 is made of a substance having a thermal expansion coefficient smaller than that of the piezoelectric substrate 12 in the direction of SAW propagation. For example, the insulating film 26 may be made of alumina (Al$_2$O$_3$).

A description will now be given, with reference to FIG. 2A through 3C, of a method of fabricating the SAW device in accordance with the first embodiment. In FIGS. 2A through 3C, the piezoelectric substrate 12 is in the form of a wafer on which there are regions from which multiple SAW devices 10 are derived. For the sake of simplicity, only one of the multiple SAW devices 10 is illustrated in FIGS. 2A through 3C. In FIG. 3C, the wafer is divided into parts along dicing regions so that the SAW devices on the wafer can be separated from each other.

Figure 2A:
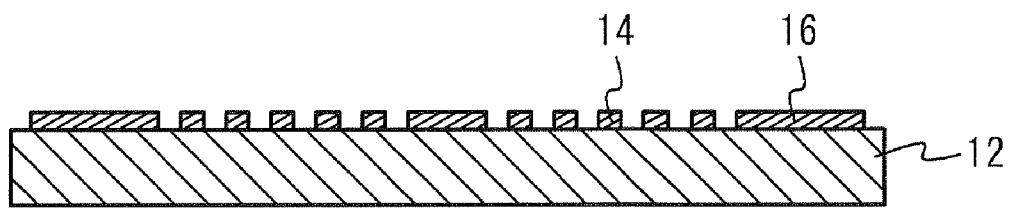
FIGS. 2A through 2D are cross-sectional views that illustrate a first part of a method of fabricating the SAW device in accordance with the first embodiment.

Referring to FIG. 2A, the comb electrodes 14, the reflection electrodes (not depicted) and the interconnection electrodes 16 are formed on the main surface of the piezoelectric substrate 12. The comb electrodes 14, the reflection electrodes and the interconnection electrodes 16 may be made of Al or an Al alloy with Cu being added, and may, for example, be 0.1-0.5 μm thick.

Figure 2B:
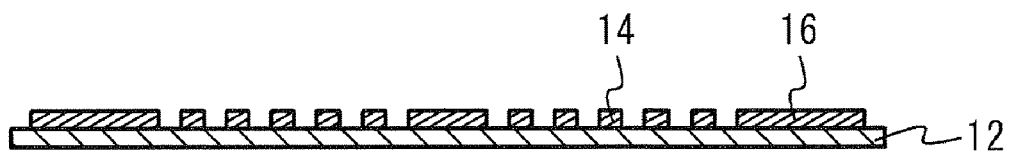

Referring to FIG. 2B, a grinding or sand blast process is carried out from the back surface of the piezoelectric substrate 12 in order to thin the piezoelectric substrate 12. The piezoelectric substrate may, for example, be 30 μm-40 μm thick after the thinning process.

Figure 2C:
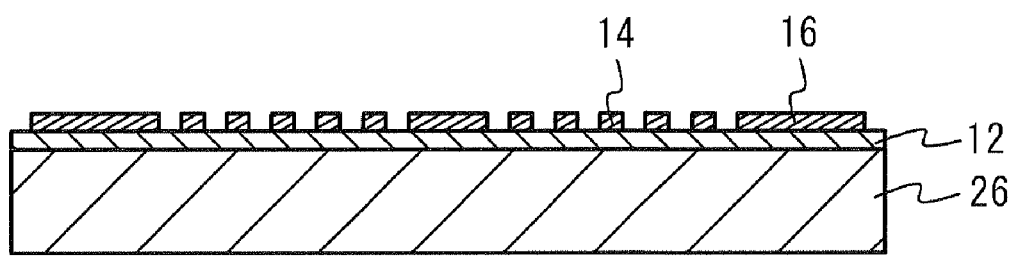

Referring to FIG. 2C, the insulating film 26 is formed on the back surface of the piezoelectric substrate 12 while the main surface of the piezoelectric substrate 12 is protected in order to prevent the comb electrodes 14, the reflection electrodes and the interconnection electrodes 16 from being functionally damaged. The insulating film 26 may be made of ceramics such as alumina (Al$_2$O$_3$), and may, for example, be 200-350 μm thick. The insulating film 26 may be formed by plasma spraying or aerosol deposition.

Figure 2D:
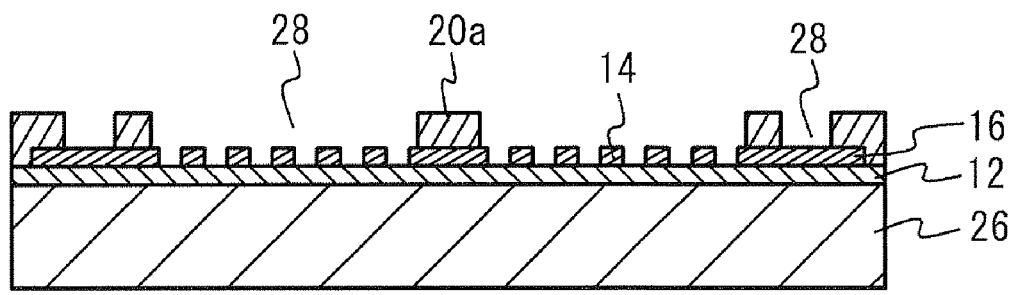

Referring to FIG. 2D, nega-type photosensitive epoxy resin 20a is applied to the main surface of the piezoelectric substrate 12 and is baked. The epoxy resin 20a may be applied by spin coating. Ultraviolet ray is applied to the epoxy resin 20a with a mask. In this application, the UV ray is not applied to regions in which the cavities 18 above the comb electrodes 14 should be formed and regions in which the column electrodes 22 should be formed above the interconnection electrodes 16. Then, the epoxy resin 20a is developed to remove the epoxy resin 20a in the regions to which the UV ray is not applied. This results in openings 28 in the regions in which the cavities 18 should be formed and the regions in which the column electrodes 22 should be formed. Then, the epoxy resin 20a is annealed at 200° C. for one hour in a nitrogen atmosphere and is thus cured.

Figure 3A:
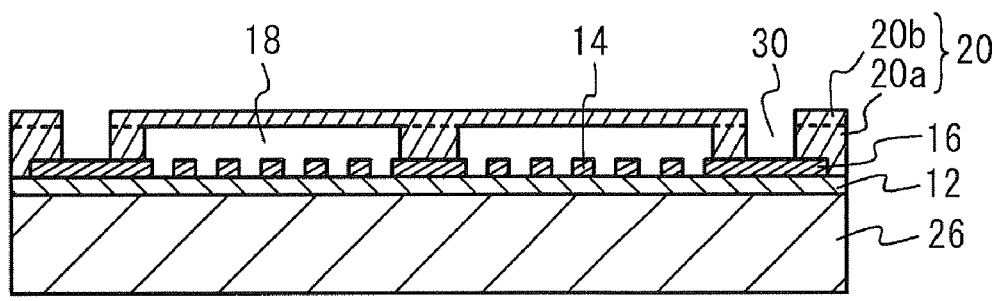
FIGS. 3A through 3C are cross-sectional views that illustrate a second part of the method following the first part.

Referring to FIG. 3A, nega-type photosensitive epoxy resin 20b is formed on the epoxy resin 20a so as to cover the openings 28. The epoxy resin 20b may be formed by, for example, pressure rolling such as a laminator. The UV ray is applied to the epoxy resin 20b with a mask. In this application, the UV ray is not applied to the regions in which the column electrodes 22 above the interconnection electrodes 16 should be formed. Then, the epoxy resin 20b is developed to remove the epoxy resin 20b in the regions on which the UV ray is not applied. After that, the epoxy resin 20b is annealed at 200° C. for one hour in a nitrogen atmosphere and is thus cured. This results in the resin portion 20 that is formed by the epoxy resin 20a and the epoxy resin 20b and is equipped with the cavities 18 above the comb electrodes 14 and openings above the interconnection electrodes 16.

Figure 3B:
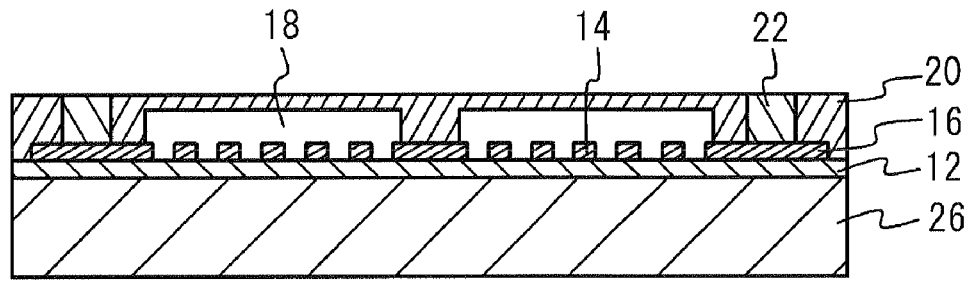
Figure 3C:
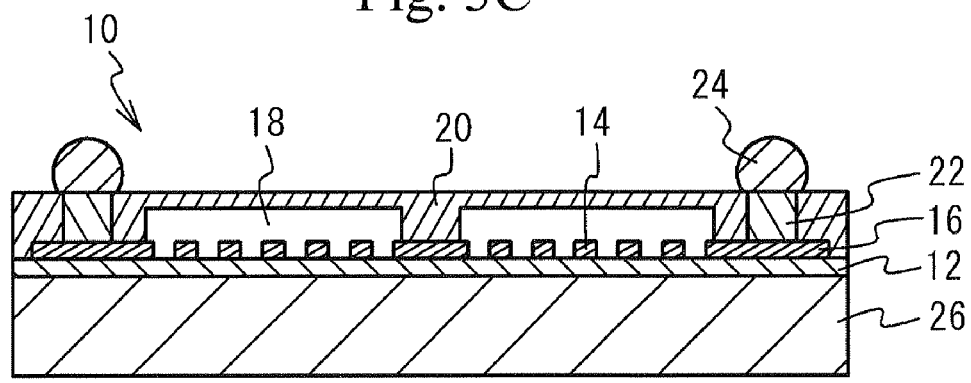

Referring to FIG. 3B, the openings 30 are filled with a metal of, for example, Cu, Ni or Au to form the column electrodes 22. This process may use electrolytic plating or electroless plating. Squeegee printing on the resin portion 20 may be employed to form the column electrodes 22 in the openings 30.

Referring to FIG. 3C, the solder bumps 24 are formed on the column electrodes 22. The solder bumps 24 may be SnAg solder balls. Then, the wafer is cut into pieces by dicing in the dicing regions so that the individual SAW devices 10 of the WLP structure can be obtained.

Figure 4:
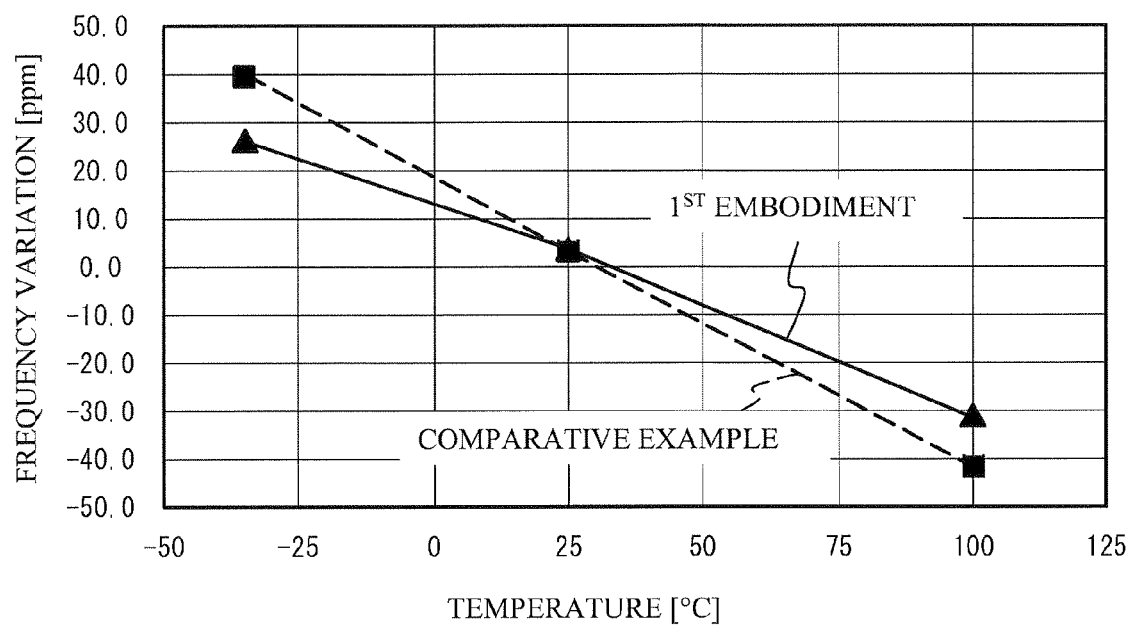
FIG. 4 is a graph that describes a temperature dependence of frequency of the SAW device in accordance with the first embodiment.

FIG. 4 is a graph of a temperature dependence of frequency of a filter using the SAW devices configured by the first embodiment. FIG. 4 further depicts a comparative example of the temperature dependence of frequency of a filter using the conventional SAW devices. Table 1 describes the particulars of the SAW devices of the first embodiment and those of the conventional SAW devices used in measurement.

TABLE 1

|  | 1st embodiment | Comparative example |
| --- | --- | --- |
| Piezoelectric substrate | LiTaO$_3$, 40 μm thick | LiTaO$_3$, 180 μm thick |
| Insulating film | Al$_2$O$_3$, 310 μm thick | None |
| Method of forming insulating film | Plasma spraying |  |

Referring to Table 1, the SAW devices of the first embodiment use the piezoelectric substrate 12 that is 40 μm thick and is made of LiTaO$_3$ and the insulating film 26 that is 310 μm thick and is made of alumina (Al$_2$O$_3$). The insulating film 26 of alumina is formed by plasma spraying. The other specifications are the same as those that have been described with reference to FIG. 1. The SAW devices of the comparative example uses the piezoelectric substrate 12 that is 180 μm thick and is made of LiTaO$_3$, but does not have the insulating film 26. The other specifications are similar to those of the first embodiment used in measurement.

The horizontal axis of the graph of FIG. 4 denotes the temperature (° C.), and the vertical axis denotes frequency variation (ppm). A solid line in FIG. 4 is the measurement result for the SAW devices of the first embodiment, and a broken line is the measurement result for the conventional SAW devices. The measurement is carried out at the center frequency of the pass band (approximately equal to 1 GHz) of the filters. It can be seen from FIG. 4 that the filter using the SAW devices of the first embodiment has a smaller frequency variation than that of the filter using the conventional SAW devices due to temperature change.

According to the first embodiment, as depicted in FIG. 1, the comb electrodes 14 are formed on the main surface of the piezoelectric substrate 12, and the insulating film 26 that is thicker than the piezoelectric substrate 12 is provided on the back surface of the piezoelectric substrate 12. The insulating film 26 is made of a substance having a thermal expansion coefficient smaller than that of the piezoelectric substrate 12 in the direction of SAW propagation. For example, the thermal expansion coefficient of LiTaO$_3$ for the piezoelectric substrate 12 is approximately 16 ppm/° C., and alumina for the insulating film 26 is approximately 7 ppm/° C. When the piezoelectric substrate 12 is used alone, it has an amount of expansion and contraction that depends on the thermal expansion coefficient of the piezoelectric substrate 12. In contrast, the piezoelectric substrate 12 with the insulating film 26 being added to the backside thereof has restrained expansion and contraction due to the presence of the insulating film 26. It is thus possible to reduce frequency variation due to temperature change, as illustrated in FIG. 4, and to produce the SAW devices having improved temperature characteristics.

According to the fabrication method of the first embodiment, the comb electrodes 14 are formed on the main surface of the piezoelectric substrate 12, as illustrated in FIG. 2A. Thereafter, the piezoelectric substrate 12 is thinned, as illustrated in FIG. 2B. Then, the insulating film 26 is formed on the back surface of the piezoelectric substrate 12 by spraying or aerosol deposition, as illustrated in FIG. 2C. For example, in a case where the insulating film 26 is formed on the back surface of the piezoelectric substrate 12 by bonding, the comb electrodes 14 are formed on the main surface of the piezoelectric substrate 12 after bonding. The presence of the insulating film 26 on the piezoelectric substrate 12 may increase warpage of the piezoelectric substrate 12. However, according to the first embodiment, the comb electrodes 14 are formed on the main surface of the piezoelectric substrate 12 before the insulating film 26 is formed. It is thus possible to easily perform patterning of the comb electrodes 14 on the piezoelectric substrate 12 that is not yet warped greatly. Spraying or aerosol deposition is capable of reliably forming the insulating film 26 on the back surface of the piezoelectric substrate 12 without affecting the comb electrodes 14 on the surface of the piezoelectric substrate 12 that has been thinned. Further, thinning of the piezoelectric substrate 12 causes it to be increasingly influenced by the insulating film 26 and more greatly restrains expansion and contraction due to temperature change.

Further, as depicted in FIGS. 2A and 3A, the cavities 18 provided above the comb electrodes 14 are defined by the resin portion 20 made of photosensitive epoxy resin. It is thus possible to form the cavities 18 easily.

Second Embodiment

Figure 5:
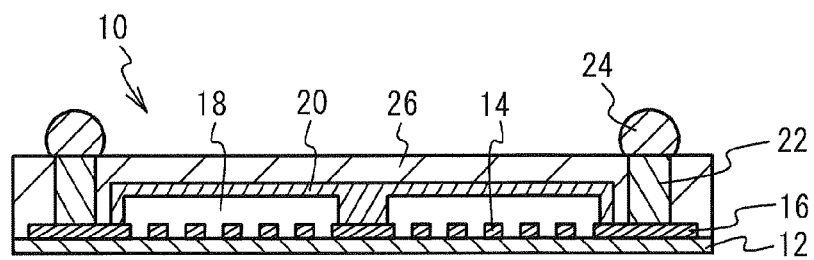
FIG. 5 is a cross-sectional view of a SAW device in accordance with a second embodiment of the present invention.

A second embodiment has an exemplary structure in which the insulating film 26 is formed on the main surface of the piezoelectric substrate 12. FIG. 5 is a cross-sectional view of a SAW device in accordance with the second embodiment taken along a line so that cross sections of the comb electrodes 14 and the column electrodes appear.

Referring to FIG. 5, the SAW device 10 has the piezoelectric substrate 12 having the main surface on which the comb electrodes 14, the reflection electrodes (not illustrated) and the interconnection electrodes 16 are formed. The comb electrodes 14 and the interconnection electrodes 16 are electrically connected. The resin portion 20 is provided on the surface of the piezoelectric substrate 12 so that the cavities 18 can be defined above the comb electrodes 14. The insulating film 26 is thicker than the piezoelectric substrate 12, and has a linear expansion coefficient greater than that of the piezoelectric substrate 12 in the direction of SAW propagation. The column electrodes 22 are provided on the interconnection electrodes 16 so as to pass through the insulating film 26. The solder bumps 24 are provided on the column electrodes 22.

Figure 6A:
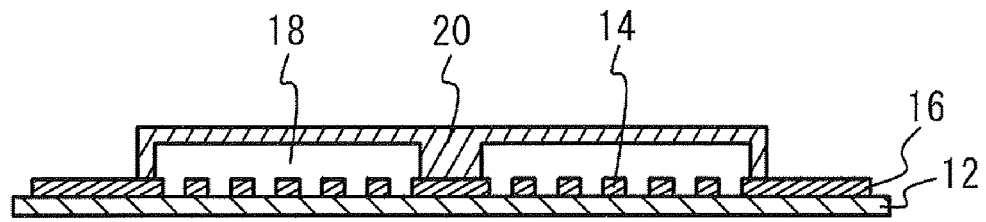
FIGS. 6A through 6C are cross-sectional views that illustrate a first part of a method of fabricating the SAW device in accordance with the second embodiment.
Figure 6B:
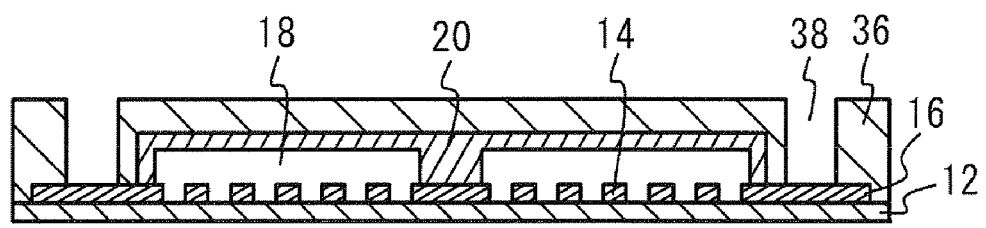
Figure 6C:
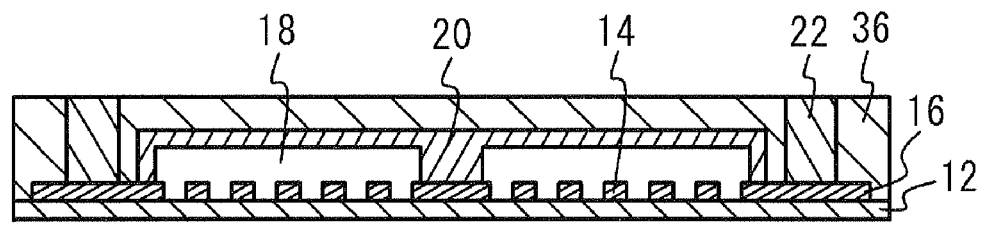

A description will now be given of a method of fabricating the SAW device of the second embodiment with reference to FIGS. 6A through 7C. In FIGS. 6A through 7C, the piezoelectric substrate 12 is in the form of a wafer on which there are regions from which multiple SAW devices 10 are derived. For the sake of simplicity, only one of the multiple SAW devices 10 is illustrated in FIGS. 6A through 7C. In FIG. 7C, the wafer is divided into parts along dicing regions so that the SAW devices on the wafer can be separated from each other.

First, the fabrication steps of FIGS. 2A and 2B related to the first embodiment are carried out. Next, referring to FIG. 6A, the resin portion 20 is formed on the main surface of the piezoelectric substrate 12 so as to define the cavities 18 above the comb electrodes 14. The resin portion 20 may be formed by the method that has been described with reference to FIGS. 2D and 3A. Referring to FIG. 6B, photoresist 36 is applied to the surface of the piezoelectric substrate 12 and is then baked. Then, exposure, development and baking are carried out to define openings 38 in regions in which the column electrodes 22 should be formed above the interconnection electrodes 16. Referring to FIG. 6C, the column electrodes 22 are formed so as to be buried in the openings 38.

Figure 7A:
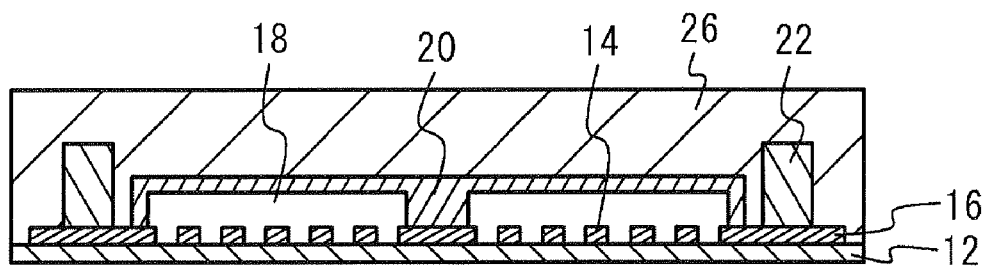
FIGS. 7A through 7C are cross-sectional views that illustrate a second part of the method following the first part.
Figure 7B:
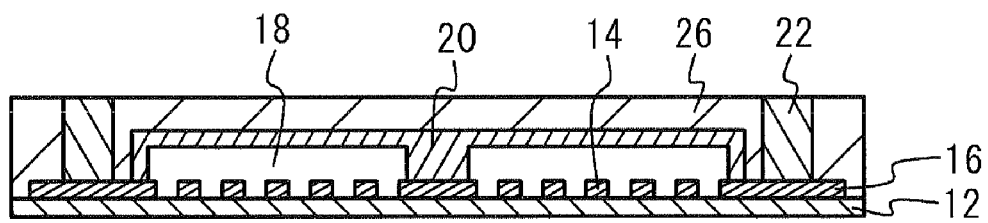
Figure 7C:
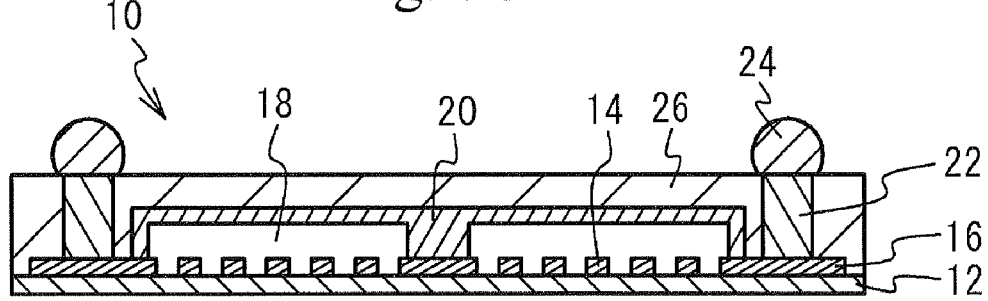

Referring to FIG. 7A, the photoresist 36 is removed and the insulating film 26 is formed on the main surface of the piezoelectric substrate 12 so as to cover the resin portion 20 and the column electrodes 22. The insulating film 26 may be formed by plasma spraying or aerosol deposition. Referring to FIG. 7B, the insulating film 26 is thinned by grinding or sand blast until the surfaces of the column electrodes 22 appear. Referring to FIG. 7C, the solder bumps 24 are formed on the column electrodes 22. Then, the piezoelectric substrate 12 in the form of wafer is divided in pieces by dicing, so that the SAW devices 10 of the WLP structure in accordance with the second embodiment can be completed.

According to the second embodiment, as illustrated in FIG. 5, the SAW device 10 has the insulating film 26 provided on the piezoelectric substrate 12 in which the insulating film 26 has a thickness greater than that of the piezoelectric substrate 12 and a thermal expansion coefficient smaller than that of the piezoelectric substrate 12 in the direction of SAW propagation. It is thus possible to restrain expansion and contraction of the piezoelectric substrate 12 due to temperature change and improve the temperature characteristics.

As depicted in FIG. 5, the insulating film 26 is formed so as to cover the resin portion 20 on the surface of the piezoelectric substrate 12. The cavities 18 above the comb electrodes 14 are defined by the resin portion 20. If the insulating film 26 is formed so as not to cover the resin portion 20, the resin portion 20 may be dented due to external pressure and the cavities 18 may be crashed. In contrast, the second embodiment employs the insulating film 26 so as to cover the resin portion 20, so that the resin portion 20 can be reinforced to prevent the cavities 18 from being crashed.

Figure 8:
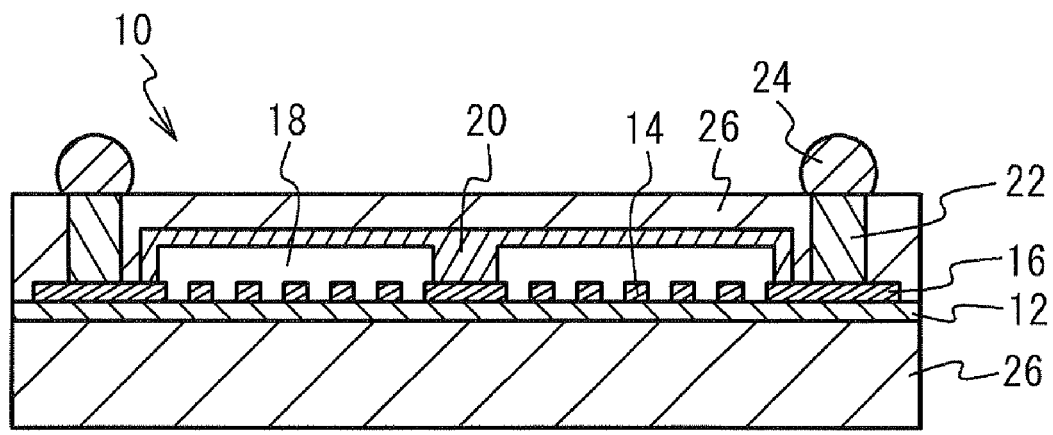
FIG. 8 is a cross-sectional view of a SAW device in accordance with a third embodiment.

A third embodiment has an exemplary structure in which the insulating films 26 are provided on both the front and back surfaces of the piezoelectric substrate 12. FIG. 8 is a cross-sectional view of a SAW device in accordance with the third embodiment taken along a line so that the cross sections of the comb electrodes 14 and the column electrodes 22 appear.

Referring to FIG. 8, the SAW device 10 has the piezoelectric substrate 12 on which the comb electrodes 14, the reflection electrodes (not illustrated) and the interconnection electrodes 16 are formed. The comb electrodes 14 and the interconnection electrodes 16 are electrically connected. The resin portion 20 is formed on the main surface of the piezoelectric substrate 12 so that the cavities 18 can be defined above the comb electrodes 14. The insulating film 26 is formed on the main surface of the piezoelectric substrate 12 so as to cover the resin portion 20. The column electrodes 22 are formed on the interconnection electrodes 16 so as to pass through the insulating film 26 on the main surface of the piezoelectric substrate 12. The solder bumps 24 are formed on the column electrodes 22. The insulating film 26 is provided on the back surface of the piezoelectric substrate 12. The insulating films 26 provided on both the front and back surfaces of the piezoelectric substrate 12 have a thickness greater than that of the piezoelectric substrate 12 and have a smaller linear expansion coefficient than that of the piezoelectric substrate 12 in the direction of SAW propagation.

A method of fabricating the SAW device in accordance with the third embodiment will now be described. First, the fabrication steps of FIGS. 2A through 2C described in connection with the first embodiment are carried out. Next, the fabrication steps of FIGS. 6A through 7C described in connection with the second embodiment are carried out. Thus, the SAW device 10 of the WLP structure is completed.

According to the third embodiment, as illustrated in FIG. 8, the insulating films 26 are formed on both the front and back surfaces of the piezoelectric substrate 12. It is thus possible to greatly suppress expansion and contraction of the piezoelectric substrate 12 due to temperature change, as compared to the first and second embodiments and to obtain the SAW device having further improved temperature characteristics.

The insulating film 26 formed on the main surface of the piezoelectric substrate 12 covers the entire resin portion 20, as illustrated in FIG. 8. It is thus possible to reinforce the resin portion 20 and prevent the cavities 18 from being crashed.

The insulating films 26 formed on both the front and back surfaces of the piezoelectric substrate 12 may be made of an identical material or different materials.

Fourth Embodiment

Figure 9:
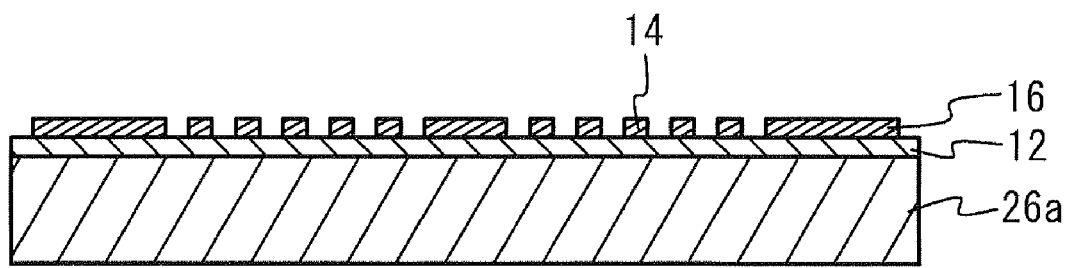
FIG. 9 is a cross-sectional view of a SAW device in accordance with a fourth embodiment.

A fourth embodiment has an exemplary structure in which an insulating film 26a made of ceramics containing glass is formed on the back surface of the piezoelectric substrate 12. FIG. 9 is a cross-sectional view of a SAW device in accordance with the fourth embodiment. The piezoelectric substrate 12 is in the form of a wafer on which there are regions from which multiple SAW devices 10 are derived. For the sake of simplicity, only one of the multiple SAW devices 10 is illustrated in FIG. 9.

First, the fabrication steps of FIGS. 2A through 2C are carried out. Next, referring to FIG. 9, the insulating film 26a made of ceramics containing glass is formed on the back surface of the piezoelectric substrate 12. Glass may be contained in ceramics by spin coating in which ceramics is coated with silanol compound liquid solution and is then baked. The silanol compound liquid solution sinks in ceramics so that the insulating film 26a made of ceramics containing glass can be obtained. Then, the fabrication steps illustrated in FIGS. 2D through 3C are carried out, so that the SAW device 10 of the WLP structure can be completed in accordance with the fourth embodiment.

According to the fourth embodiment, as illustrated in FIG. 9, the insulating film 26a made of ceramics containing glass is formed on the back surface of the piezoelectric substrate 12. The insulating film 26a has a greater Young's module than that of an insulating film that does not contain glass. As the Young's module increases, the insulating film is harder and is more indeformable. It is thus possible to further restrain expansion and contraction of the piezoelectric substrate 12 due to temperature change by employing the insulating film 26a having a great Young's module on the back surface of the piezoelectric substrate 12 and to realize the SAW device having further improved temperature characteristics.

Various variations of the fourth embodiment are available. The insulating film 26a of ceramics containing glass is not formed on the back surface of the piezoelectric substrate 12 but on the main surface thereof. It is also possible to form the insulating films 26a on both the front and back surfaces of the piezoelectric substrate 12. These variations are capable of further suppressing expansion and contraction of the piezoelectric substrate 12 due to temperature change and providing the SAW device having further improved temperature characteristics.

In the first through fourth embodiments, at least one of the front and back surfaces of the thinned piezoelectric substrate 12 is provided with the insulating film 26. The piezoelectric substrate 12 may not be thinned. Even when the piezoelectric substrate 12 that is not thinned is used, it is possible to restrain expansion and contraction of the piezoelectric substrate 12 and to realize the SAW device having improved temperature characteristics.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A surface acoustic wave device comprising:
    a piezoelectric substrate;
    comb electrodes provided on a first surface of the piezoelectric substrate;
    a resin portion that defines cavities above the comb electrodes; and
    an insulating film provided on the first surface of the piezoelectric substrate so as to cover the resin portion,
    the insulating film having a thickness greater than that of the piezoelectric substrate and having a linear expansion coefficient smaller than that of the piezoelectric substrate in a direction of propagation of a surface acoustic wave.

2. The surface acoustic wave device according to claim 1, wherein the insulating film is provided on both the first surface of the piezoelectric substrate and a second surface thereof opposite to the first surface.

3. The surface acoustic wave device according to claim 1, wherein the insulating film includes ceramics.

4. The surface acoustic wave device according to claim 1, wherein the insulating film includes ceramics that contains glass.

* * * * *